United States Patent
Wappis et al.

(10) Patent No.: US 9,876,328 B1
(45) Date of Patent: Jan. 23, 2018

(54) DRIVING LIGHT EMITTING ELEMENTS WITH REDUCED VOLTAGE DRIVERS

(71) Applicant: Infineon Technologies AG, Neubiberg (DE)

(72) Inventors: Herwig Wappis, Villach (AT); Fabrizio Cortigiani, di Vigonza (IT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/419,514

(22) Filed: Jan. 30, 2017

(51) Int. Cl.
| | |
|---|---|
| H01S 5/00 | (2006.01) |
| H01S 5/042 | (2006.01) |
| H05B 33/08 | (2006.01) |
| H01S 5/40 | (2006.01) |
| H01S 5/026 | (2006.01) |
| H01S 5/068 | (2006.01) |
| H01S 5/42 | (2006.01) |

(52) U.S. Cl.
CPC ............ H01S 5/042 (2013.01); H01S 5/0261 (2013.01); H01S 5/068 (2013.01); H01S 5/4025 (2013.01); H05B 33/0824 (2013.01); H05B 33/0845 (2013.01); *H01S 5/405* (2013.01); *H01S 5/42* (2013.01)

(58) Field of Classification Search
CPC ...... H01S 5/042; H01S 5/4025; H01S 5/0261; H01S 5/068; H01S 5/405; H01S 5/42
See application file for complete search history.

(56) References Cited

U.S. PATENT DOCUMENTS

| | | | | | |
|---|---|---|---|---|---|
| 5,546,218 | A | * | 8/1996 | Komatsubara | G02F 1/0121 359/237 |
| 5,764,667 | A | * | 6/1998 | Luque | H01S 5/0428 372/38.07 |
| 6,037,832 | A | * | 3/2000 | Kaminishi | H01S 5/042 323/312 |
| 7,529,282 | B2 | * | 5/2009 | Ikeda | H01S 5/042 372/38.01 |
| 2008/0054979 | A1 | * | 3/2008 | Nagumo | H03K 3/356104 327/309 |
| 2011/0089865 | A1 | * | 4/2011 | Wang | H05B 33/0827 315/297 |

OTHER PUBLICATIONS

"Spotlight," HELLA Group, retrieved on Aug. 17, 2016 from http://www.hella.com/hella-com/de/Scheinwerfer-620.html, 2 pp.

* cited by examiner

*Primary Examiner* — Kinam Park
(74) *Attorney, Agent, or Firm* — Shumaker & Sieffert, P.A.

(57) ABSTRACT

In one example, a method includes outputting, by a power supply and across a supply node and a ground node, a supply power signal; and selectively outputting, by a driver, a power signal to a second terminal of a light emitting element that has a first terminal and the second terminal, wherein the first terminal of the light emitting element is coupled to a load node, wherein a supply terminal of the driver is coupled to the supply node, wherein a ground terminal driver is coupled to the ground node, and wherein a difference between a potential of the supply node and a potential of the ground node is less than an activation voltage of the light emitting element.

20 Claims, 6 Drawing Sheets

DRIVING LIGHT EMITTING ELEMENTS WITH REDUCED VOLTAGE DRIVERS

TECHNICAL FIELD

This disclosure relates to driver circuits, and in particular, to using one or more drivers to control components with requirements that exceed capabilities of the drivers.

BACKGROUND

Driver circuits may be used to control the light emitted by light emitting elements, such as light emitting diodes (LEDs). For instance, a driver circuit may output a power signal to a light emitting element. Once a voltage drop across the light emitting element becomes greater than an activation voltage (i.e., a forward voltage) of the light emitting element, the light emitting element may emit light. The brightness of the light emitted by the light emitting element may be proportional to an average current level of the power signal.

In some examples, a system may include a plurality of light emitting elements that are dimmable either independently or in groups by a plurality of drivers. For instance, an adaptive front light system (uAFS) of a vehicle, a projector, a display screen, may include a plurality of a plurality of light emitting elements that are dimmable either independently or in groups by a plurality of drivers. In some examples, such as where the light emitting elements are LEDs, the cathodes of the LEDs may be commonly connected to the same ground (e.g., for high side drivers) or supply (e.g., for low side drivers) used by the drivers to drive the LEDs. As technology progresses, it may be desirable for systems to include more and more light emitting elements, which may result in an increase in the quantity of drivers included in the system whilst keeping the same footprint (e.g. increased resolution).

SUMMARY

In one example, a method includes outputting, by a power supply and across a supply node and a ground node, a supply power signal; and selectively outputting, by a driver, a power signal to a second terminal of a light emitting element that has a first terminal and the second terminal, wherein the first terminal of the light emitting element is coupled to a load node, wherein a supply terminal of the driver is coupled to the supply node, wherein a ground terminal driver is coupled to the ground node, and wherein a difference between a potential of the supply node and a potential of the ground node is less than an activation voltage of the light emitting element.

In another example, a system includes a light emitting element that includes a first terminal and a second terminal, wherein the first terminal is coupled to a load node; a driver configured to supply a power signal to the second terminal of the light emitting element, wherein the driver includes a supply terminal coupled to a supply node and a ground terminal coupled to a ground node, and wherein a difference between a potential of the supply node and a potential of the ground node is less than an activation voltage of the light emitting element; and a power supply configured to supply a common power signal to the load node, wherein a difference between a potential of the load node and the potential of the supply node is greater than the activation voltage of the light emitting element.

In another example, a system includes a light emitting element that includes a first terminal and a second terminal, wherein the first terminal is coupled to a load node; a driver configured to supply a power signal to the second terminal of the light emitting element, wherein the driver includes a supply terminal coupled to a supply node and a ground terminal coupled to a ground node; a first power supply configured to supply a power signal across the supply terminal and the ground terminal, wherein a difference between a potential of the supply node and a potential of the ground node is less than an activation voltage of the light emitting element; and a second power supply configured to supply a power signal either: across the ground node and the load node such that a difference between a potential of the supply node and the potential of the load node is greater than the activation voltage of the light emitting element; or across the load node and the supply node such that a difference between a potential of the load node and the potential of the ground node is greater than the activation voltage of the light emitting element.

In another example, a system includes means for outputting, across a supply node and a ground node, a supply power signal; and means for selectively outputting, by a driver, a power signal to a second terminal of a light emitting element that has a first terminal and the second terminal, wherein the first terminal of the light emitting element is coupled to a load node, wherein a supply terminal of the driver is coupled to the supply node, wherein a ground terminal driver is coupled to the ground node, and wherein a difference between a potential of the supply node and a potential of the ground node is less than an activation voltage of the light emitting element.

The details of one or more examples of the invention are set forth in the accompanying drawings and the description below. Other features, objects, and advantages of the invention will be apparent from the description and drawings, and from the claims.

DETAILED ABSTRACT OF THE INVENTION

In general, this disclosure is directed to using drivers to drive light emitting elements having activation voltage levels greater than voltage levels at which the drivers are configured to operate. As discussed above, it may be desirable for systems to include more and more light emitting elements, which may result in an increase in the quantity of drivers included in the system. However, it may not be desirable to increase the size taken up by the drivers (i.e., the board space) and/or it may be desirable to reduce the amount of power consumed by the drivers. To avoid increasing the size taken up by the increased number of drivers and/or to reduce the amount of power consumed by the increased number of drivers, drivers with reduced voltage drop capacity may be utilized. For instance, complementary metal oxide semiconductor (CMOS) drivers configured to operate up to 3.3 Volts (V) may be used. However, as a result in the voltage drop reduction, the drivers may not be able to generate power signals that can exceed activation voltages of light emitting elements. For instance, a 3.3 V CMOS driver may not be capable of driving an LED with a forward voltage greater than 3.3 V.

In accordance with one or more techniques of this disclosure, a common terminal of a plurality of light emitting elements may be connected to a node that is different than a ground used by a plurality of drivers that drive the plurality of light emitting elements. As one example, the plurality of drivers may generate respective power signals for output to respective non-common terminals of the light emitting elements based on a ground voltage and a power supply may pull the common terminals below the ground voltage. For instance, where the plurality of light emitting elements each have an activation voltage of 4 V, the plurality of drivers may generate the respective power signals using a 3.3 V supply referenced to a ground voltage and the power supply may pull the common terminals at least 0.7 V below the ground voltage such that the voltage drop across the light emitting elements satisfies the activation voltage. In some examples, there may be a voltage drop across the drivers. As such, in some examples, the common terminals may be pulled further below the ground voltage than the difference between the activation voltage and the supply voltage.

As another example, the plurality of drivers may generate respective power signals for output to respective non-common terminals of the light emitting elements based on a floating ground voltage and a power supply may pull the floating ground above a ground voltage. For instance, where the plurality of light emitting elements each have an activation voltage of 4 V, the plurality of drivers may generate the respective power signals using a 3.3 V supply referenced to a floating ground and the power supply may pull the floating ground at least 0.7 V above a ground voltage such that the voltage drop across the light emitting elements satisfies the activation voltage.

Figure 1:
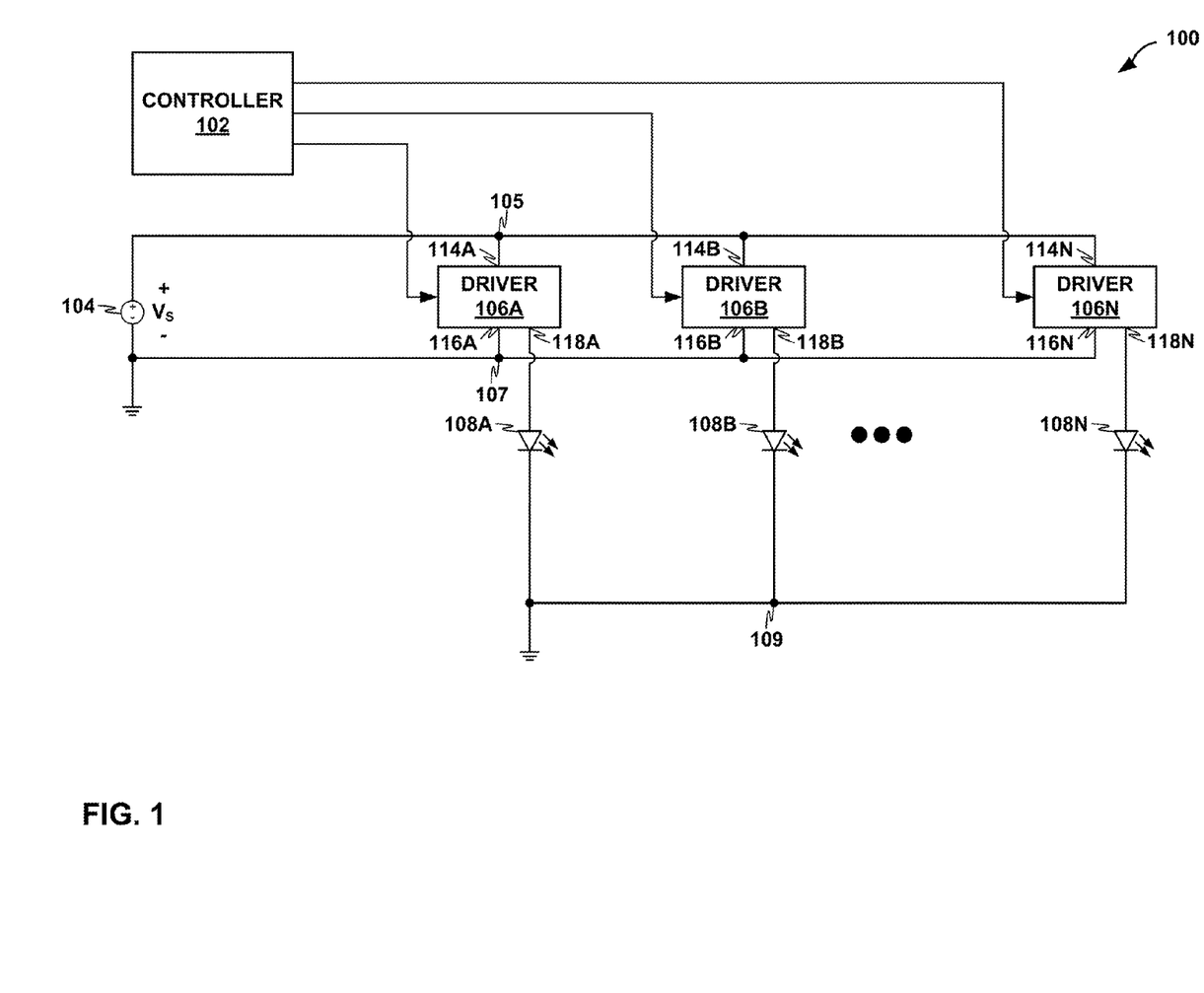
FIG. 1 is a conceptual diagram illustrating system 100 for operating a plurality of light emitting elements, in accordance with one or more aspects of the present disclosure.

FIG. 1 is a conceptual diagram illustrating system 100 for operating a plurality of light emitting elements, in accordance with one or more aspects of the present disclosure. As illustrated in FIG. 1, system 100 may include controller 102, power supply 104, drivers 106A-106N (collectively, "drivers 106"), and light emitting elements 108A-108N (collectively, "light emitting elements 108"). System 100 may be included in a variety of different systems. For instance, system 100 may be included in a vehicle, a computer display, a projector, or any other system where direct or backlight pixelated illumination is used (e.g., LCD systems retro-illumination with local dimming, DLP illuminators as adaptive light sources).

Controller 102 may be configured to control one or more aspects of system 100. For instance, controller 102 may be configured to selectively activate and/or adjust a brightness of light emitting elements 108. As discussed in further detail below, controller 102 may selectively activate and/or adjust a brightness of a light emitting element of light emitting elements 108 by adjusting an amount of power provided to the light emitting element by a corresponding driver of drivers 106. Examples of controller 102 may include, but are not limited to, one or more processors, including, one or more microprocessors, digital signal processors (DSPs), application specific integrated circuits (ASICs), field programmable gate arrays (FPGAs), or any other equivalent integrated or discrete logic circuitry, as well as any combinations of such components.

Power supply 104 may be configured to provide electrical power to system 100. Examples of power supply 104 may include, but are not limited to, batteries, power converters (e.g., DC/DC converters, AC/DC converters, AC/AC converters, and/or DC/AC converters). For instance, as shown in FIG. 1, power supply 104 may be a voltage source that provides electrical power to drivers 106 at voltage level Vs. In some examples, power supply 104 may receive power from a main power supply. As one example, where system 100 is integrated into a vehicle, power supply 104 may receive power from a battery of the vehicle. As another example, where system 100 is integrated into a projector that is plugged into an electrical grid (i.e., via a plug, socket, outlet, etc.), power supply 104 may receive power from the electrical grid.

Drivers 106 may be configured to provide power to drive loads based on control signals. For instance, each of drivers 106 may be configured to drive a light emitting element of light emitting elements 108. In the example of FIG. 1, driver 106A may be configured to output a power signal to drive light emitting element 108A via output terminal 118A, driver 106B may be configured to output a power signal to drive light emitting element 108B via output terminal 118B, . . . , and driver 106N may be configured to output a power signal to drive light emitting element 108N via output terminal 118N. Drivers 106 may output the power signals using a supply power signal received from a power supply, such as power supply 104. Each of drivers 106 may include a supply terminal and a ground terminal across which the supply power signal may be received. For instance, driver 106A may include supply terminal 114A and ground terminal 116A, driver 106B may include supply terminal 114B and ground terminal 116B, . . . , and driver 106N may include supply terminal 114N and ground terminal 116N. Supply terminals 114A-114N (collectively, "supply terminals 114") may be connected to a common supply node. For instance, supply terminals 114 may be connected to supply node 105, which may be connected to one side of power supply 104. Ground terminals 116A-116N (collectively, "ground terminals 116") may be connected to a common ground node. For instance, ground terminals 116 may be connected to ground node 107, which may be connected to another side of power supply 104.

Drivers 106 may be configured to operate at a particular voltage level. For instance, drivers 106 may supply power signals to light emitting elements 108 using a 5V supply power signal received from power supply 104 (i.e., Vs may be 5V). Operation above the particular voltage level may result in damage to, or failure of, drivers 106. Example of drivers 106 include integrated circuits (ICs), discrete components, or combinations of ICs and discrete components.

Light emitting elements 108 may be configured to emit light. Examples of light emitting elements 108 include one or more light bulbs, one or more light emitting diodes (LEDs), one or more laser diodes, and any other type of electroluminescent component. Each of light emitting elements 108 may include two terminals. A first terminal of each of light emitting elements 108 (i.e., an anode where drivers 106 are "high side" or a cathode where drivers 106 are "low side") may be connected to a corresponding driver of drivers 106. A second terminal of light emitting elements 108 (i.e., a cathode where drivers 106 are "high side" or an anode where drivers 106 are "low side") may be connected to a common node. For instance, second terminals of each of light emitting elements 108 may be connected to common load node 109. In the example of FIG. 1, common load node 109 may be connected to ground such that the voltage across power supply 104 is the same as the voltage across the combination of drivers 106 and light emitting elements 108. Such second terminals may be referred to as the common terminal of light emitting elements 108.

In some examples, each of light emitting elements 108 may represent a single light emitting element. For instance, each of light emitting elements 108 may represent a single LED. In some examples, each of light emitting elements 108 may represent a plurality of light emitting elements. For instance, each of light emitting elements 108 may represent a plurality of LEDs arranged in series, parallel, or a matrix.

In operation, once a voltage drop across light emitting element of light emitting elements 108 becomes greater than an activation voltage (i.e., a forward voltage) of the light emitting element, the light emitting element may emit light. The brightness of the light emitted by the light emitting element may be proportional to an average current level of a power signal provided to the light emitting element by the corresponding driver of drivers 106.

In some examples, it may be desirable to increase the number of light emitting elements of light emitting elements 108 included in system 100. However, such an increase may result in an increase in the quantity of drivers of drivers 106 included in system 100 (i.e., in order to retain independent control of light emitting elements 108). However, it may not be desirable to increase the size taken up by drivers 106 (i.e., the board space) and/or it may be desirable to reduce the amount of power consumed by drivers 106. In some examples, driver technologies with reduced voltage drop capacity may be utilized as drivers 106 in order to avoid increasing the size taken up by the increased number of drivers 106 and/or to reduce the amount of power consumed by the increased number of drivers 106. For instance, complementary metal oxide semiconductor (CMOS) drivers configured to operate up to 3.3 Volts (V) may be used as drivers 106. However, as a result in the voltage drop reduction, drivers 106 may not be able to generate power signals that can exceed activation voltages of light emitting elements 108. For instance, a 3.3 V CMOS driver may not be capable of driving an LED with a forward voltage greater than 3.3 V.

In accordance with one or more techniques of this disclosure, the common terminal of light emitting elements may be separated from a ground potential or a supply potential of drivers 106 (ground where drivers 106 are "high side" or supply where drivers 106 are "low side"). For instance, driver technologies a voltage drop capacity less than an activation voltage of light emitting elements 108 may be utilized as drivers 106 and additional components may be included to enable a total voltage drop across light emitting elements 108 to exceed the activation voltage.

As one example, discussed in further detail below with reference to FIG. 2 and FIG. 3, the common node of light emitting elements 108 may be biased with a common power signal such that a difference between a potential of the common power signal and the potential of the supply power signal received by drivers 106 is greater than the activation voltage of light emitting elements 108. For instance, where light emitting elements 108 each have an activation voltage of 4 V, drivers 106 may generate the respective power signals using a 3.3 V supply referenced to a ground voltage and the common terminal of light emitting elements 108 may be pulled at least 0.7 V below the ground voltage such that the voltage drop across light emitting elements 108 satisfies the activation voltage.

As another example, discussed in further detail below with reference to FIG. 4 and FIG. 5, drivers 106 may be made "floating" such that a ground potential or a supply potential of drivers 106 (ground where drivers 106 are "high side" or supply where drivers 106 are "low side") may be different than a potential of the common node of light emitting elements 108. For instance, where light emitting elements 108 each have an activation voltage of 4 V, drivers 106 may generate the respective power signals using a 3.3 V supply referenced to a floating ground and the floating ground may be pulled at least 0.7 V above a ground voltage such that the voltage drop across light emitting elements 108 satisfies the activation voltage.

Figure 2:
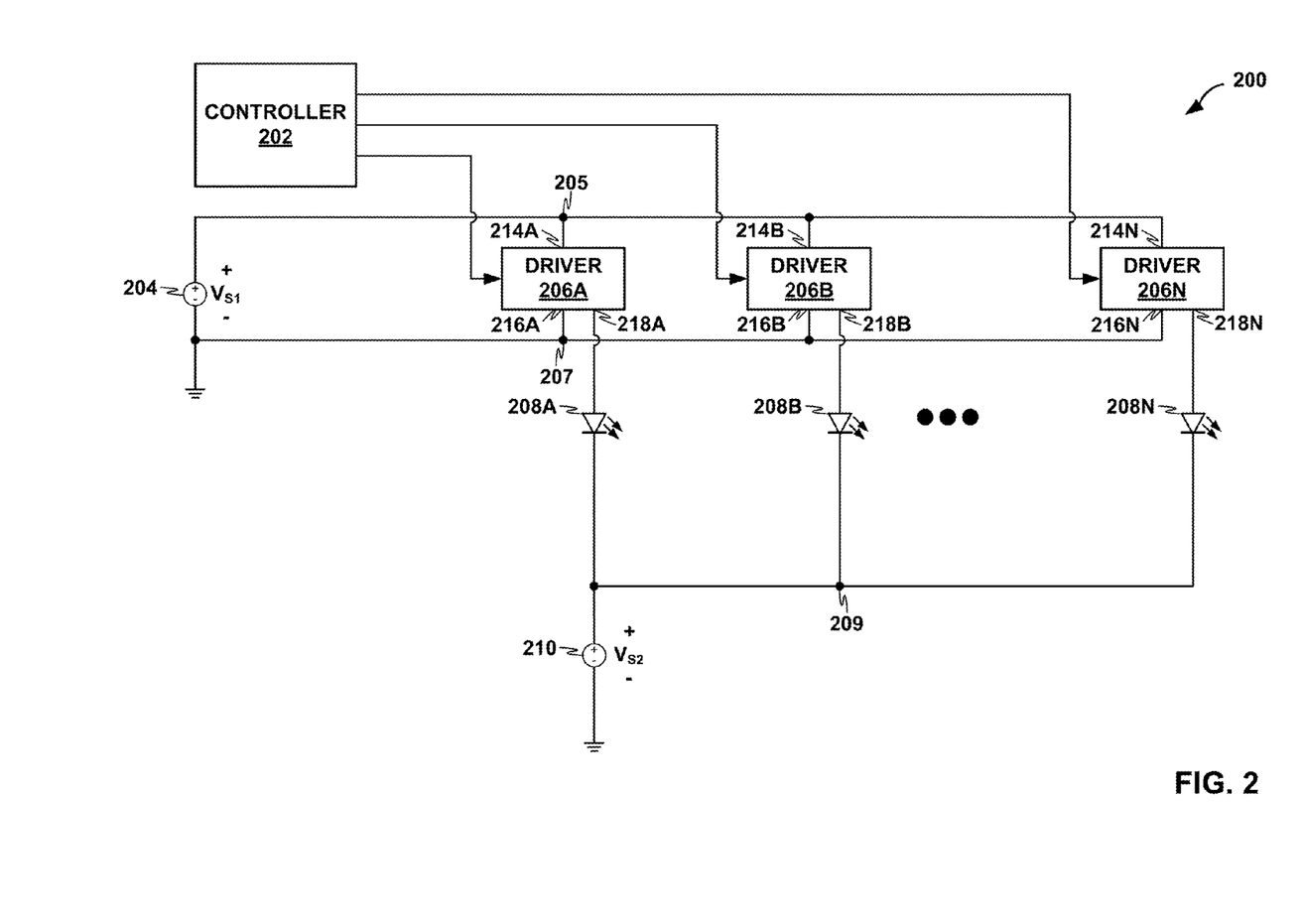
FIG. 2 is a conceptual diagram illustrating system 200 for operating a plurality of light emitting elements, in accordance with one or more aspects of the present disclosure.

FIG. 2 is a conceptual diagram illustrating system 200 for operating a plurality of light emitting elements, in accordance with one or more aspects of the present disclosure. System 200 may be an example of system 100 in which the common node of the light emitting elements is biased with a common power signal such that a difference between a potential of the common power signal and the potential of the supply power signal received by the drivers is greater than the activation voltage of the light emitting elements.

As illustrated in FIG. 2, system 200 may include controller 202, power supply 204, drivers 206A-206N (collectively, "drivers 206"), light emitting elements 208A-208N (collectively, "light emitting elements 208"), and power supply 210. Controller 202, power supply 204, drivers 206, and light emitting elements 208 may be respectively configured to perform operations similar to controller 102, power supply 104, drivers 106, and light emitting elements 108 of FIG. 1. For instance, controller 202 may be configured to selectively activate and/or adjust a brightness of light emitting elements 208, power supply 204 may be configured to supply a power signal having voltage $V_{S1}$ to drivers 206, drivers 206 may each be configured to drive a light emitting element of light emitting elements 208, and light emitting elements 208 may be configured to emit light.

In operation, drivers 206 may generate the respective power signals using a supply power signal having a voltage of $V_{S1}$ with reference to ground 207. However, the voltages of the respective power signals generated by drivers 206 may not be greater than an activation voltage of light emitting elements 208.

In accordance with one or more techniques of this disclosure, a common terminal of light emitting elements 208 may be connected to a node that is different than a ground used by drivers 206. As shown in FIG. 2, the cathodes of light emitting elements 208 may be connected to node 209, and drivers 206 may be connected to ground 207.

System 200 may include power supply 210, which may be configured to provide electrical power to one or more components of system 200. For instance, power supply 210 may be configured to supply a power signal having voltage $V_{S2}$ to a common node of light emitting elements 208. The power signal supplied by power supply 210 may have a negative voltage with respect to ground. In other words, power supply 210 may negatively supply a common node of light emitting elements 208.

As discussed above, the voltages of the respective power signals generated by drivers 206 may not be greater than an activation voltage of light emitting elements 208. However, by biasing the common node of light emitting elements 208 to a different potential than the ground used by drivers 206, the resulting potential difference across light emitting elements 208 may satisfy the activation voltage of light emitting elements 208. In other words, $V_{S1}-V_{S2}$ may be greater than or equal to the activation voltage of light emitting elements 208. As such, by selectively outputting power signals to light emitting elements 208, drivers 206 may selectively activate light emitting elements 208 even though drivers 206 are supplied with a voltage that is less than the activation voltage of light emitting elements 208.

While illustrated in FIG. 2 in a high-side topology, the techniques of this disclosure are equally applicable to low-side topologies. In a low-side topology, the anodes of light emitting elements 208 positively supplied. For instance, the anodes of light emitting elements 208 may be connected to a common node, which is pulled-up by power supply 210.

Figure 3:
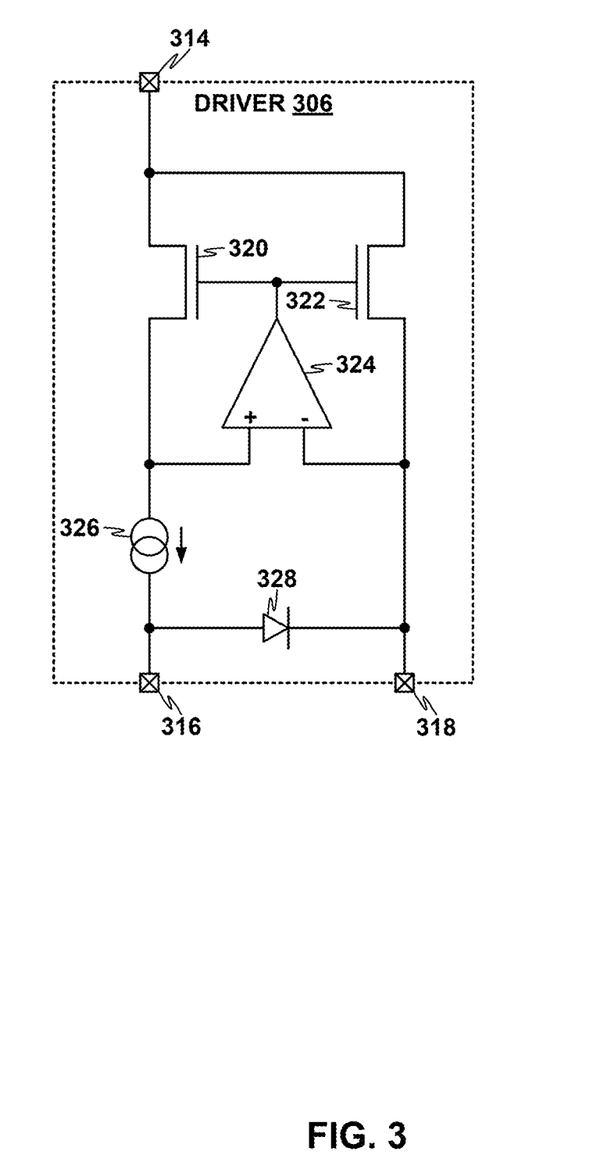
FIG. 3 is a schematic diagram illustrating further details of one example of a driver, in accordance with one or more aspects of the present disclosure.

FIG. 3 is a schematic diagram illustrating further details of one example of a driver, in accordance with one or more aspects of the present disclosure. Driver 300 may be an example of driver 100 of FIG. 1 and/or driver 200 of FIG. 2. As illustrated in FIG. 3, driver 300 may include supply terminal 314, ground terminal 316, output terminal 318, transistors 320 and 322, amplifier 324, current source 326, and diode 328. As discussed above, drivers may be configured to operate at a particular voltage level. For instance, driver 306 may be rated to operate using a supply voltage across supply terminal 314 and ground terminal 316 that less than the particular voltage level. Operation above the particular voltage level may result in damage to, or failure of, one or more components of driver 306.

Figure 4:
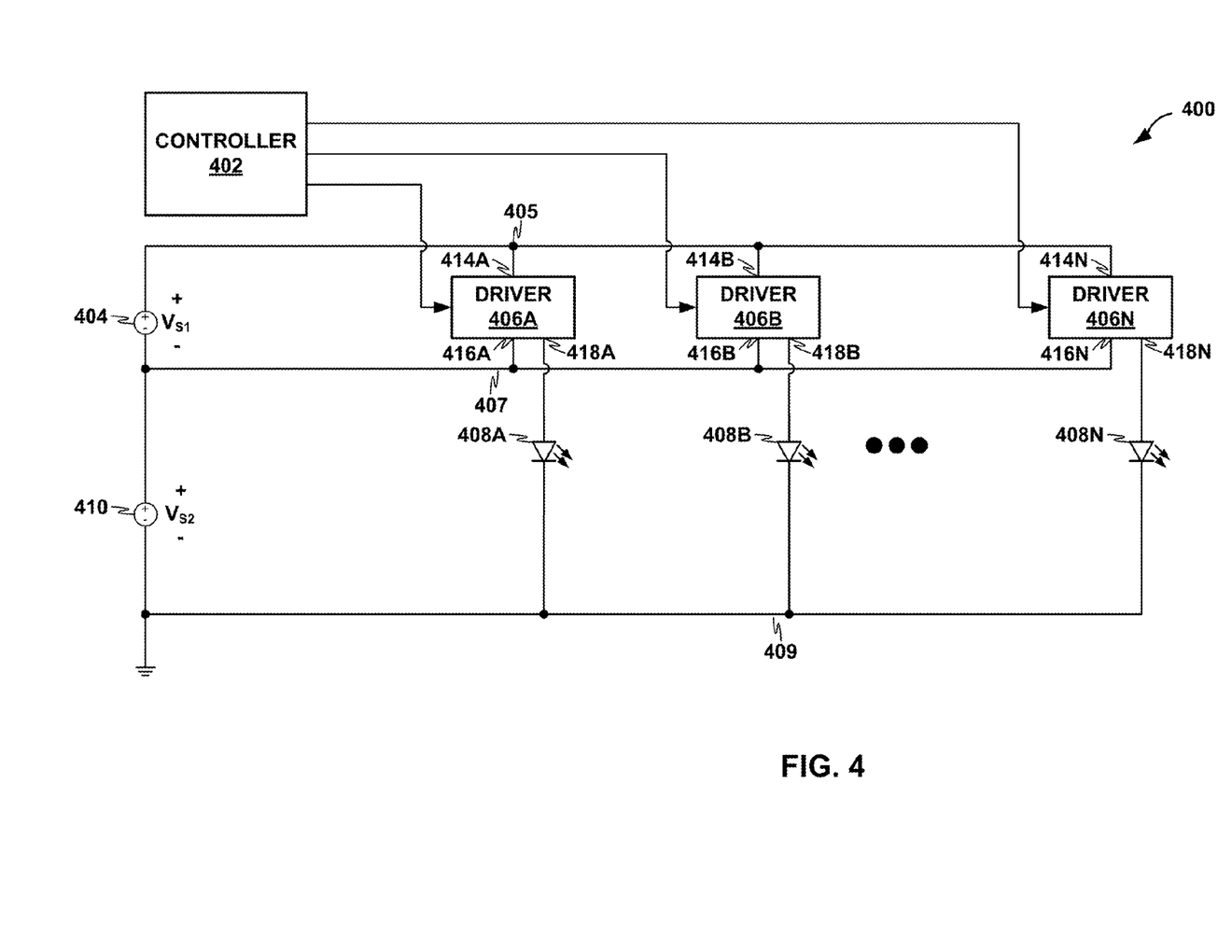
FIG. 4 is a conceptual diagram illustrating system 400 for operating a plurality of light emitting elements, in accordance with one or more aspects of the present disclosure.

FIG. 4 is a conceptual diagram illustrating system 400 for operating a plurality of light emitting elements, in accordance with one or more aspects of the present disclosure. System 400 may be an example of system 100 in which the drivers are made floating such that a ground potential of the drivers may be different than a potential of the common node of the light emitting elements.

As illustrated in FIG. 4, system 400 may include controller 402, power supply 404, drivers 406A-406N (collectively, "drivers 406"), light emitting elements 408A-408N (collectively, "light emitting elements 408"), and power supply 410. Controller 402, power supply 404, drivers 406, and light emitting elements 408 may be respectively configured to perform operations similar to controller 102, power supply 104, drivers 106, and light emitting elements 108 of FIG. 1. For instance, controller 402 may be configured to selectively activate and/or adjust a brightness of light emitting elements 408, power supply 404 may be configured to supply a power signal having voltage $V_{S1}$ across supply terminals 414A-414N (collectively, "supply terminals 414") of drivers 406, drivers 406 may each be configured to drive a light emitting element of light emitting elements 408, and light emitting elements 408 may be configured to emit light. However, as shown in the example of FIG. 4, power supply 410 may be configured to supply a power signal having voltage $V_{S2}$ to the common ground terminal of drivers 406 (i.e., common ground node 407). In other words, the ground terminals of drivers 406 may be connected to a floating ground, which is biased to $V_{S2}$ by power supply 410.

In operation, drivers 406 may generate the respective power signals using a supply power signal having a voltage of $V_{S1}$ with reference to floating ground 407. However, the voltages of the respective power signals generated by drivers 406 may not be greater than an activation voltage of light emitting elements 408.

In accordance with one or more techniques of this disclosure, a common terminal of light emitting elements 408 may be connected to a node that is different than a ground used by drivers 406. As shown in FIG. 4, the cathodes of light emitting elements 408 may be connected to node 409, and the ground terminals of drivers 406 may be connected to ground 407.

System 400 may include power supply 410, which may be configured to provide electrical power to one or more components of system 400. For instance, power supply 410 may be configured to supply a power signal having voltage $V_{S2}$ to floating ground 407, to which the ground terminals of drivers 406 are connected.

As discussed above, the voltages of the respective power signals generated by drivers 406 may not be greater than an activation voltage of light emitting elements 408. However, by biasing the common ground node used by drivers 406 to a different potential than the common node of light emitting elements 408, the resulting potential difference across light emitting elements 408 may satisfy the activation voltage of light emitting elements 408. In other words, $V_{S1}+V_{S2}$ may be greater than or equal to the activation voltage of light emitting elements 408. As such, by selectively outputting power signals to light emitting elements 408, drivers 406 may selectively activate light emitting elements 408 even though drivers 406 are supplied with a voltage that is less than the activation voltage of light emitting elements 408.

Figure 5:
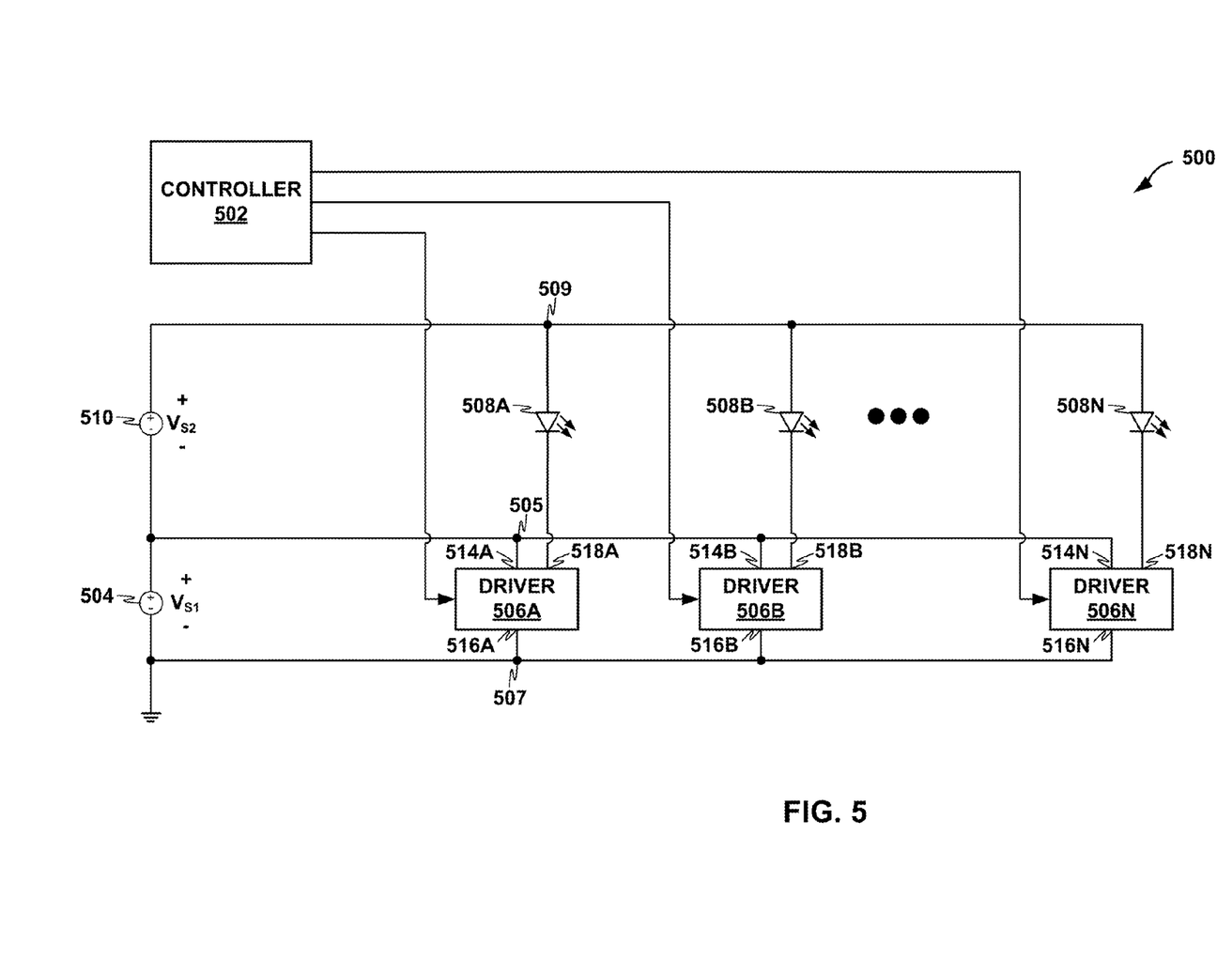
FIG. 5 is a conceptual diagram illustrating system 500 for operating a plurality of light emitting elements, in accordance with one or more aspects of the present disclosure.

FIG. 5 is a conceptual diagram illustrating system 500 for operating a plurality of light emitting elements, in accordance with one or more aspects of the present disclosure. Similar to system 400 of FIG. 4, system 500 may be an example of system 100 in which the drivers are made floating such that a ground potential of the drivers may be different than a potential of the common node of the light emitting elements. However, as opposed to system 400 which is illustrated and described in a high-side topology, system 500 is illustrated and described in a low-side topology.

As illustrated in FIG. 5, system 500 may include controller 502, power supply 504, drivers 506A-506N (collectively, "drivers 506"), light emitting elements 508A-508N (collectively, "light emitting elements 508"), and power supply 510. Controller 502, power supply 504, drivers 506, and light emitting elements 508 may be respectively configured to perform operations similar to controller 402, power supply 404, drivers 406, and light emitting elements 408 of FIG. 4. For instance, controller 502 may be configured to selectively activate and/or adjust a brightness of light emitting elements 508, power supply 504 may be configured to supply a power signal having voltage $V_{S1}$ across supply terminals 514A-514N (collectively, "supply terminals 514") of drivers 506, drivers 506 may each be configured to drive a light emitting element of light emitting elements 508, and light emitting elements 508 may be configured to emit light. However, as shown in the example of FIG. 5, power supply 510 may be configured to supply a power signal having voltage $V_{S2}$ across common node 509, to which the common terminals of light emitting elements 508 are connected, and common supply node 505, to which supply terminals 514 of drivers 506 are connected.

In operation, drivers 506 may generate the respective power signals using a supply power signal having a voltage of $V_{S1}$ with reference to ground node 507. However, the voltages of the respective power signals generated by drivers 506 may not be greater than an activation voltage of light emitting elements 508.

In accordance with one or more techniques of this disclosure, a common terminal of light emitting elements 508 may be connected to a node that is different than a ground used by drivers 506. As shown in FIG. 5, the anodes of light emitting elements 508 may be connected to node 509, and the ground terminals of drivers 506 may be connected to ground node 507.

As discussed above, the voltages of the respective power signals generated by drivers 506 may not be greater than an activation voltage of light emitting elements 508. However, by biasing common load node 509 above the potential of supply node 505 used by drivers 506, the resulting potential difference across light emitting elements 508 may satisfy the activation voltage of light emitting elements 508. In other words, $V_{S1}+V_{S2}$ may be greater than or equal to the activation voltage of light emitting elements 508. As such, by selectively outputting power signals to light emitting elements 508, drivers 506 may selectively activate light emitting elements 508 even though drivers 506 are supplied with a voltage that is less than the activation voltage of light emitting elements 508.

Figure 6:
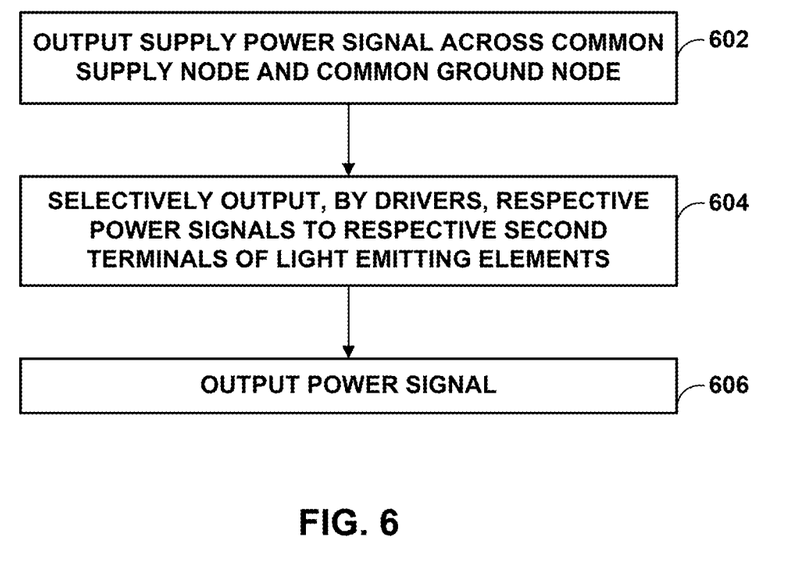
FIG. 6 is a flowchart illustrating example operations of an example system, in accordance with one or more techniques of this disclosure.

FIG. 6 is a flowchart illustrating example operations of an example system, in accordance with one or more techniques of this disclosure. For purposes of illustration only, the example operations are described below within the context of system 200, as shown in FIG. 2.

Power supply 204 of system 200 may output a supply power signal across a common supply node and a common ground node (602). For instance, power supply 204 may output a 3.3V power signal across common supply node 205 and common ground node 207 of system 200.

Drivers 206 may selectively output respective power signals to respective second terminals of light emitting elements (604). For instance, drivers 206 may output respective power signals to respective light emitting elements of light emitting elements 208 via output terminals 218. As discussed above, first terminals of the plurality of light emitting elements may be coupled to a common load node, supply terminals of the plurality of drivers may be coupled to the common supply node, ground terminals of the plurality of drivers may be coupled to the common ground node. For instance, first terminals of light emitting elements 208 may be coupled to common load node 209, supply terminals 214 of drivers 206 may be coupled to common supply node 205, and ground terminals 216 of drivers 206 may be coupled to common ground node 207. As also discussed above, a difference between a potential of the common supply node and a potential of the common ground node may be less than an activation voltage of the light emitting elements.

In accordance with one or more techniques of this disclosure, power supply 210 may output a power signal to enable the respective output signals generated by drivers 206 to driver light emitting elements 208 (606). For instance, power supply 210 may output, across common load node 209 and common ground node 207, a power signal. The outputting of this power signal may cause a difference between a potential of the common load node and the potential of the common supply node to exceed the activation voltage of the light emitting elements.

As discussed above, these techniques may be implemented in other manners. As one example, power supply 410 of system 400 of FIG. 4 may output, across common ground node 407 and common load node 409, a power signal such that a difference between a potential of common supply node 405 and the potential of common load node 409 is greater than the activation voltage of light emitting elements 408. As another example, power supply 510 of system 500 of FIG. 5 may output, across common load node 509 and common supply node 505, a power signal such that a difference between a potential of common load node 509 and the potential of common ground node 507 is greater than the activation voltage of light emitting elements 508.

The following examples may illustrate one or more aspects of the disclosure.

Example 1

A system comprising: a light emitting element that includes a first terminal and a second terminal, wherein the first terminal is coupled to a load node; a driver configured to supply a power signal to the second terminal of the light emitting element, wherein the driver includes a supply terminal coupled to a supply node and a ground terminal coupled to a ground node, and wherein a difference between a potential of the supply node and a potential of the ground node is less than an activation voltage of the light emitting element; and a power supply configured to supply a common power signal to the load node, wherein a difference between a potential of the load node and the potential of the supply node is greater than the activation voltage of the light emitting element.

Example 2

The system of example 1, wherein a design operating voltage of the driver is less than the activation voltage of the light emitting element.

Example 3

The system of any combination of examples 1-2, wherein the potential of the power signal supplied by the power supply is negative with reference to the potential of the ground node, and wherein a potential of the power signal supplied by the driver is positive with reference to the potential of the ground node.

Example 4

The system of any combination of examples 1-3, wherein the light emitting element comprises one or more light emitting diodes (LEDs) or laser diodes arranged in either series or parallel.

Example 5

The system of any combination of examples 1-4, wherein the light emitting element comprises a single light emitting diode (LED) or a single laser diode.

Example 6

The system of any combination of examples 1-5, further comprising: a plurality of light emitting elements that includes the light emitting element, wherein each of the plurality of light emitting elements includes a first terminal and a second terminal, wherein first terminals of the plurality of light emitting elements are coupled to the load node; and a plurality of drivers that includes the driver, wherein each of the plurality of driver is configured to supply a power signal to a second terminal of a respective light emitting element of the plurality of light emitting elements, wherein the plurality of drivers each include a supply terminal and a ground terminal, wherein supply terminals of the plurality of drivers are coupled to the supply node, wherein ground terminals of the plurality of drivers are coupled to the ground node.

Example 7

A system comprising: a light emitting element that includes a first terminal and a second terminal, wherein the first terminal is coupled to a load node; a driver configured to supply a power signal to the second terminal of the light emitting element, wherein the driver includes a supply terminal coupled to a supply node and a ground terminal coupled to a ground node; a first power supply configured to supply a power signal across the supply terminal and the ground terminal, wherein a difference between a potential of the supply node and a potential of the ground node is less than an activation voltage of the light emitting element; and a second power supply configured to supply a power signal either: across the ground node and the load node such that a difference between a potential of the supply node and the potential of the load node is greater than the activation voltage of the light emitting element; or across the load node and the supply node such that a difference between a potential of the load node and the potential of the ground node is greater than the activation voltage of the light emitting element.

Example 8

The system of example 7, wherein a design operating voltage of the driver is less than the activation voltage of the light emitting element.

Example 9

The system of any combination of examples 7-8, wherein the light emitting element comprises one or more light emitting diodes (LEDs) or laser diodes arranged in either series or parallel.

Example 10

The system of any combination of examples 7-8, wherein the light emitting element comprises a single light emitting diode (LED) or a single laser diode.

Example 11

The system of any combination of examples 7-10, further comprising: a plurality of light emitting elements that includes the light emitting element, wherein each of the plurality of light emitting elements includes a first terminal and a second terminal, wherein first terminals of the plurality of light emitting elements are coupled to the load node; and a plurality of drivers that includes the driver, wherein each of the plurality of driver is configured to supply a power signal to a second terminal of a respective light emitting element of the plurality of light emitting elements, wherein the plurality of drivers each include a supply terminal and a ground terminal, wherein supply terminals of the plurality of drivers are coupled to the supply node, wherein ground terminals of the plurality of drivers are coupled to the ground node.

Example 12

A method comprising: outputting, by a power supply and across a supply node and a ground node, a supply power signal; and selectively outputting, by a driver, a power signal to a second terminal of a light emitting element that has a first terminal and the second terminal, wherein the first terminal of the light emitting element is coupled to a load node, wherein a supply terminal of the driver is coupled to the supply node, wherein a ground terminal driver is coupled to the ground node, and wherein a difference between a potential of the supply node and a potential of the ground node is less than an activation voltage of the light emitting element.

Example 13

The method of example 12, further comprising: outputting, by a power supply and across the load node and the ground node, a power signal, wherein a difference between a potential of the load node and the potential of the supply power signal received by the driver is greater than the activation voltage of the light emitting element.

Example 14

The method of any combination of examples 12-13, further comprising: outputting, by a first power supply and across the supply node and the ground node, a first power signal; and outputting, by a second power supply and across the ground node and the load node, a second power signal such that a difference between a potential of the supply node and the potential of the load node is greater than the activation voltage of the light emitting element.

Example 15

The method of any combination of examples 12-13, further comprising: outputting, by a first power supply and across the supply node and the ground node, a first power signal; and outputting, by a second power supply and across the load node and the supply node, a second power signal such that a difference between a potential of the load node and the potential of the ground node is greater than the activation voltage of the light emitting element.

Example 16

The method of any combination of examples 12-13, further comprising: selectively outputting, by drivers of a plurality of drivers that includes the driver, respective power signals to respective second terminals of a plurality of light emitting elements that includes the light emitting element, wherein each of the plurality of light emitting elements includes a first terminal and a second terminal, wherein first terminals of the plurality of light emitting elements are coupled to the load node, wherein supply terminals of the plurality of drivers are coupled to the supply node, wherein ground terminals of the plurality of drivers are coupled to the ground node.

Example 17

The method of any combination of examples 12-16, wherein a design operating voltage of the plurality of drivers is less than the activation voltage of the light emitting elements.

Example 18

The method of any combination of examples 12-17, wherein each of the light emitting elements comprises one or more light emitting diodes (LEDs) or laser diodes arranged in either series or parallel.

Example 19

The method of any combination of examples 12-17, wherein each of the light emitting elements comprises a single light emitting diode (LED) or a single laser diode.

Example 20

The method of any combination of examples 12-19, wherein the plurality of light emitting elements are included in a vehicle.

Example 21

A system comprising: a plurality of light emitting elements that each include a first terminal and a second terminal, wherein first terminals of the plurality of light emitting elements are coupled to a common load node; a plurality of drivers that are each configured to supply a power signal to a second terminal of a respective light emitting element of the plurality of light emitting elements, wherein the plurality of drivers each include a supply terminal and a ground terminal, wherein supply terminals of the plurality of drivers are coupled to a common supply node, wherein ground terminals of the plurality of drivers are coupled to a common ground node, and wherein a difference between a potential of the common supply node and a potential of the common ground node is less than an activation voltage of the light emitting elements; and a power supply configured to supply a common power signal to the common load node, wherein a difference between a potential of the common load node and the potential of the common supply node is greater than the activation voltage of the light emitting elements.

Example 22

A system comprising: a plurality of light emitting elements that each include a first terminal and a second terminal, wherein first terminals of the plurality of light emitting elements are coupled to a common load node; a plurality of drivers that are each configured to supply a power signal to a second terminal of a respective light emitting element of the plurality of light emitting elements, wherein the plurality of drivers each include a supply terminal and a ground terminal, wherein supply terminals of the plurality of drivers are coupled to a common supply node, and wherein ground terminals of the plurality of drivers are coupled to a common ground node; a first power supply configured to supply a power signal across the common supply node and the common ground node, wherein a difference between a potential of the common supply node and a potential of the common ground node is less than an activation voltage of the light emitting elements; and a second power supply configured to supply a power signal either: across the common ground node and the common load node such that a difference between a potential of the common supply node and the potential of the common load node is greater than the activation voltage of the light emitting elements; or across the common load node and the common supply node such that a difference between a potential of the common load node and the potential of the common ground node is greater than the activation voltage of the light emitting elements.

Example 23

A method comprising: outputting, by a power supply and across a common supply node and a common ground node, a supply power signal; and selectively outputting, by drivers of a plurality of drivers, respective power signals to respective second terminals of a plurality of light emitting elements that each have a first terminal and a second terminal, wherein first terminals of the plurality of light emitting elements are coupled to a common load node, wherein supply terminals of the plurality of drivers are coupled to the common supply node, wherein ground terminals of the plurality of drivers are coupled to the common ground node, and wherein a difference between a potential of the common supply node and a potential of the common ground node is less than an activation voltage of the light emitting elements.

The techniques described in this disclosure may be implemented, at least in part, in hardware, software, firmware, or any combination thereof. For example, various aspects of the described techniques may be implemented within one or more processors, including one or more microprocessors, digital signal processors (DSPs), application specific integrated circuits (ASICs), field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. A control unit including hardware may also perform one or more of the techniques of this disclosure.

Such hardware, software, and firmware may be implemented within the same device or within separate devices to support the various techniques described in this disclosure. In addition, any of the described units, modules or components may be implemented together or separately as discrete but interoperable logic devices. Depiction of different features as modules or units is intended to highlight different functional aspects and does not necessarily imply that such modules or units must be realized by separate hardware, firmware, or software components. Rather, functionality associated with one or more modules or units may be performed by separate hardware, firmware, or software components, or integrated within common or separate hardware, firmware, or software components.

The techniques described in this disclosure may also be embodied or encoded in an article of manufacture including a computer-readable storage medium encoded with instructions. Instructions embedded or encoded in an article of manufacture including a computer-readable storage medium encoded, may cause one or more programmable processors, or other processors, to implement one or more of the techniques described herein, such as when instructions included or encoded in the computer-readable storage medium are executed by the one or more processors. Computer readable storage media may include random access memory (RAM), read only memory (ROM), programmable read only memory (PROM), erasable programmable read only memory (EPROM), electronically erasable programmable read only memory (EEPROM), flash memory, a hard disk, a compact disc ROM (CD-ROM), a floppy disk, a cassette, magnetic media, optical media, or other computer readable media. In some examples, an article of manufacture may include one or more computer-readable storage media.

In some examples, a computer-readable storage medium may include a non-transitory medium. The term "non-transitory" may indicate that the storage medium is not embodied in a carrier wave or a propagated signal. In certain examples, a non-transitory storage medium may store data that can, over time, change (e.g., in RAM or cache).

Various aspects have been described in this disclosure. These and other aspects are within the scope of the following claims.

The invention claimed is:

1. A system comprising:
a light emitting element that includes a first terminal and a second terminal, wherein the first terminal is coupled to a load node;
a driver configured to supply a power signal to the second terminal of the light emitting element, wherein the driver includes a supply terminal coupled to a supply node and a ground terminal coupled to a ground node, and wherein a difference between a potential of the supply node and a potential of the ground node is less than an activation voltage of the light emitting element; and
a power supply configured to supply a common power signal to the load node, wherein a difference between a potential of the load node and the potential of the supply node is greater than the activation voltage of the light emitting element.

2. The system of claim 1, wherein a design operating voltage of the driver is less than the activation voltage of the light emitting element.

3. The system of claim 1, wherein the potential of the power signal supplied by the power supply is negative with reference to the potential of the ground node, and wherein a potential of the power signal supplied by the driver is positive with reference to the potential of the ground node.

4. The system of claim 1, wherein the light emitting element comprises one or more light emitting diodes (LEDs) or laser diodes arranged in either series or parallel.

5. The system of claim 1, wherein the light emitting element comprises a single light emitting diode (LED) or a single laser diode.

6. The system of claim 1, further comprising:
a plurality of light emitting elements that includes the light emitting element, wherein each of the plurality of light emitting elements includes a first terminal and a second terminal, wherein first terminals of the plurality of light emitting elements are coupled to the load node; and
a plurality of drivers that includes the driver, wherein each of the plurality of driver is configured to supply a power signal to a second terminal of a respective light emitting element of the plurality of light emitting elements, wherein the plurality of drivers each include a supply terminal and a ground terminal, wherein supply terminals of the plurality of drivers are coupled to the supply node, wherein ground terminals of the plurality of drivers are coupled to the ground node.

7. A system comprising:
a light emitting element that includes a first terminal and a second terminal, wherein the first terminal is coupled to a load node;
a driver configured to supply a power signal to the second terminal of the light emitting element, wherein the driver includes a supply terminal coupled to a supply node and a ground terminal coupled to a ground node;

a first power supply configured to supply a power signal across the supply terminal and the ground terminal, wherein a difference between a potential of the supply node and a potential of the ground node is less than an activation voltage of the light emitting element; and
a second power supply configured to supply a power signal either:
across the ground node and the load node such that a difference between a potential of the supply node and the potential of the load node is greater than the activation voltage of the light emitting element; or
across the load node and the supply node such that a difference between a potential of the load node and the potential of the ground node is greater than the activation voltage of the light emitting element.

8. The system of claim 7, wherein a design operating voltage of the driver is less than the activation voltage of the light emitting element.

9. The system of claim 7, wherein the light emitting element comprises one or more light emitting diodes (LEDs) or laser diodes arranged in either series or parallel.

10. The system of claim 7, wherein the light emitting element comprises a single light emitting diode (LED) or a single laser diode.

11. The system of claim 7, further comprising:
a plurality of light emitting elements that includes the light emitting element, wherein each of the plurality of light emitting elements includes a first terminal and a second terminal, wherein first terminals of the plurality of light emitting elements are coupled to the load node; and
a plurality of drivers that includes the driver, wherein each of the plurality of driver is configured to supply a power signal to a second terminal of a respective light emitting element of the plurality of light emitting elements, wherein the plurality of drivers each include a supply terminal and a ground terminal, wherein supply terminals of the plurality of drivers are coupled to the supply node, wherein ground terminals of the plurality of drivers are coupled to the ground node.

12. A method comprising:
outputting, by a power supply and across a supply node and a ground node, a supply power signal; and
selectively outputting, by a driver, a power signal to a second terminal of a light emitting element that has a first terminal and the second terminal, wherein the first terminal of the light emitting element is coupled to a load node, wherein a supply terminal of the driver is coupled to the supply node, wherein a ground terminal driver is coupled to the ground node, and wherein a difference between a potential of the supply node and a potential of the ground node is less than an activation voltage of the light emitting element.

13. The method of claim 12, further comprising:
outputting, by a power supply and across the load node and the ground node, a power signal, wherein a difference between a potential of the load node and the potential of the supply power signal received by the driver is greater than the activation voltage of the light emitting element.

14. The method of claim 12, further comprising:
outputting, by a first power supply and across the supply node and the ground node, a first power signal; and
outputting, by a second power supply and across the ground node and the load node, a second power signal such that a difference between a potential of the supply node and the potential of the load node is greater than the activation voltage of the light emitting element.

15. The method of claim 12, further comprising:
outputting, by a first power supply and across the supply node and the ground node, a first power signal; and
outputting, by a second power supply and across the load node and the supply node, a second power signal such that a difference between a potential of the load node and the potential of the ground node is greater than the activation voltage of the light emitting element.

16. The method of claim 12, further comprising:
selectively outputting, by drivers of a plurality of drivers that includes the driver, respective power signals to respective second terminals of a plurality of light emitting elements that includes the light emitting element, wherein each of the plurality of light emitting elements includes a first terminal and a second terminal, wherein first terminals of the plurality of light emitting elements are coupled to the load node, wherein supply terminals of the plurality of drivers are coupled to the supply node, wherein ground terminals of the plurality of drivers are coupled to the ground node.

17. The method of claim 16, wherein a design operating voltage of the plurality of drivers is less than the activation voltage of the light emitting elements.

18. The method of claim 16, wherein each of the light emitting elements comprises one or more light emitting diodes (LEDs) or laser diodes arranged in either series or parallel.

19. The method of claim 16, wherein each of the light emitting elements comprises a single light emitting diode (LED) or a single laser diode.

20. The method of claim 16, wherein the plurality of light emitting elements are included in a vehicle.

* * * * *